(12) United States Patent
Miyajima et al.

(10) Patent No.: US 7,885,299 B2
(45) Date of Patent: Feb. 8, 2011

(54) SEMICONDUCTOR LASER EQUIPMENT

(75) Inventors: Hirofumi Miyajima, Hamamatsu (JP); Hirofumi Kan, Hamamatsu (JP); Masanobu Yamanaka, Minoo (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/335,208

(22) Filed: Dec. 15, 2008

(65) Prior Publication Data

US 2009/0141758 A1    Jun. 4, 2009

Related U.S. Application Data

(62) Division of application No. 10/593,085, filed as application No. PCT/JP2005/003980 on Mar. 8, 2005, now abandoned.

(30) Foreign Application Priority Data

Mar. 17, 2004    (JP)    ............... P2004-076939

(51) Int. Cl.
*H01S 3/04*    (2006.01)
(52) U.S. Cl. ............... 372/35; 372/34; 372/36
(58) Field of Classification Search ............. 372/34–36
See application file for complete search history.

(56) References Cited

U.S. PATENT DOCUMENTS

| | | | |
|---|---|---|---|
| 6,480,514 B1 * | 11/2002 | Lorenzen et al. | 372/35 |
| 6,570,895 B2 | 5/2003 | Heberle | |
| 6,724,792 B2 * | 4/2004 | Rice | 372/36 |
| 6,970,485 B1 | 11/2005 | Kitayama et al. | |
| 7,145,927 B2 * | 12/2006 | Rice | 372/36 |
| 7,486,710 B2 * | 2/2009 | Kan et al. | 372/35 |
| 7,522,643 B2 * | 4/2009 | Miyajima et al. | 372/35 |
| 7,567,598 B2 * | 7/2009 | Miyajima et al. | 372/35 |
| 2001/0004312 A1 | 6/2001 | Miyajima et al. | |
| 2002/0018498 A1 * | 2/2002 | Heberle | 372/35 |
| 2002/0195238 A1 | 12/2002 | Takigawa et al. | |
| 2003/0024253 A1 * | 2/2003 | Smith et al. | 62/56 |
| 2004/0165628 A1 * | 8/2004 | Rice | 372/36 |
| 2004/0182544 A1 * | 9/2004 | Lee et al. | 165/80.4 |
| 2006/0215715 A1 * | 9/2006 | Kouta et al. | 372/36 |
| 2008/0043791 A1 * | 2/2008 | Miyajima et al. | 372/36 |
| 2009/0141758 A1 * | 6/2009 | Miyajima et al. | 372/36 |

FOREIGN PATENT DOCUMENTS

JP    57-141986    9/1982

(Continued)

OTHER PUBLICATIONS

JSME TED (Thermal Engineering Division) News letter No. 27, Mar. 1999, including partial English translation.

*Primary Examiner*—Minsun Harvey
*Assistant Examiner*—Delma R Forde
(74) *Attorney, Agent, or Firm*—Drinker Biddle & Reath LLP

(57) ABSTRACT

The present invention relates to a semiconductor laser apparatus having a structure for preventing the corrosion of a refrigerant flow path in a heat sink and for cooling a semiconductor laser array stably over a long period of time. The semiconductor laser apparatus comprises a semiconductor laser stack in which a plurality of semiconductor laser units are stacked, a refrigerant supplier, a piping for connecting these components, and a refrigerant flowing through these components. The refrigerant supplier supplies the refrigerant to the semiconductor laser stack. The refrigerant is comprised of fluorocarbon. Each of the semiconductor laser units is constituted by a pair of a semiconductor laser array and a heat sink. The heat sink has a refrigerant flow path.

3 Claims, 10 Drawing Sheets

FOREIGN PATENT DOCUMENTS

| | | |
|---|---|---|
| JP | 5-90463 | 4/1993 |
| JP | 6-37219 | 2/1994 |
| JP | 8-139478 | 5/1996 |
| JP | 8-139479 | 5/1996 |
| JP | 9-194204 | 7/1997 |
| JP | 10-209531 | 8/1998 |
| JP | 2000-307284 | 11/2000 |
| JP | 2003-8273 | 1/2003 |
| WO | 00/11717 | 3/2000 |
| WO | 00/11922 | 3/2000 |

* cited by examiner

Fig.7
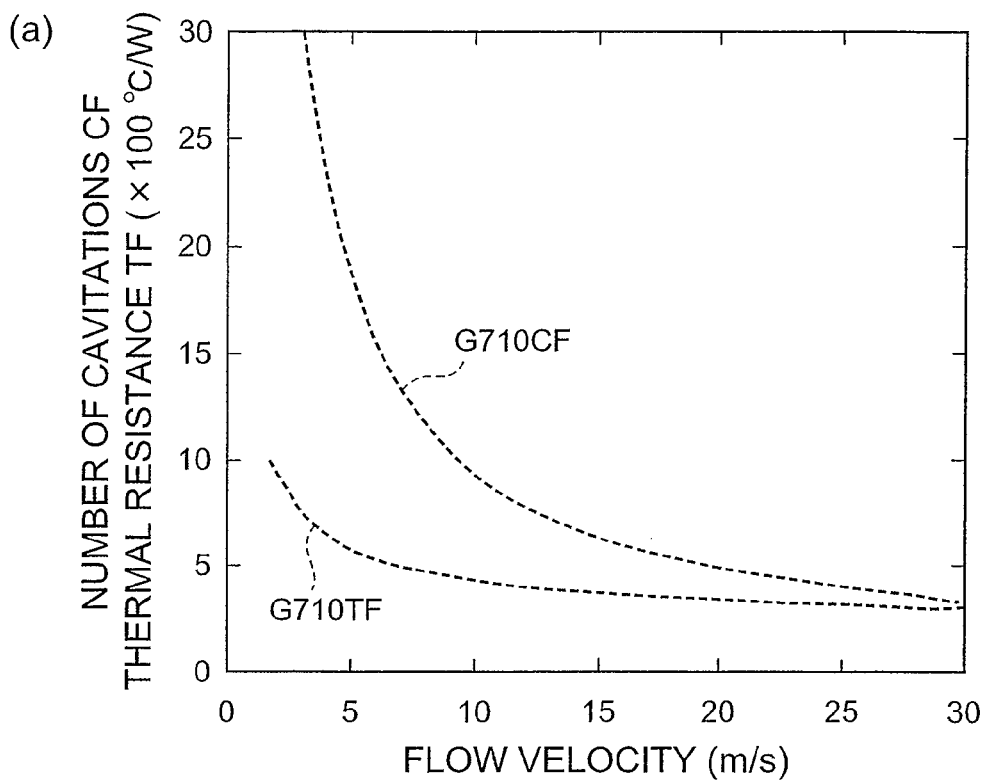
(a)
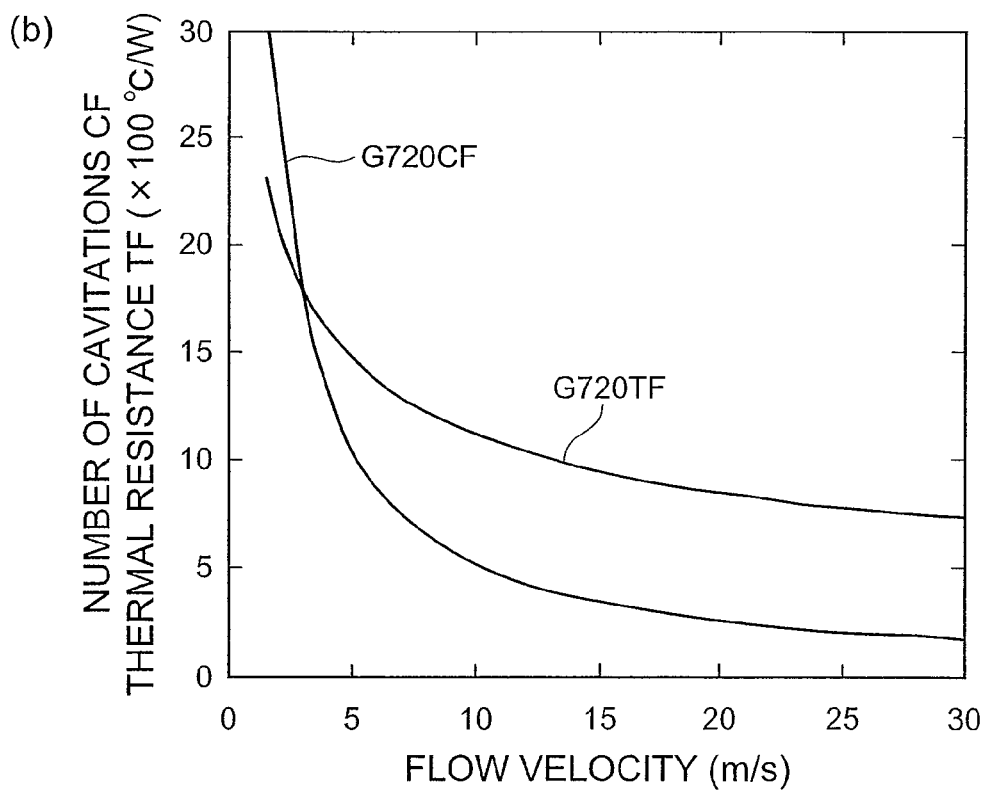
(b)

SEMICONDUCTOR LASER EQUIPMENT

This is a divisional application of copending U.S. patent application Ser. No. 10/593,085, filed on Jun. 21, 2007, (now pending) which is incorporated by reference herein in its entirety.

TECHNICAL FIELD

The present invention relates to a semiconductor laser apparatus having a semiconductor laser array as an emission source and a structure for effectively cooling the semiconductor laser array.

BACKGROUND ART

Recently, a semiconductor laser apparatus, which is capable of achieving a high output power of several to 100 W, has been developed. Such a semiconductor laser apparatus is also used as a light source of, for example, a laser knife, a laser soldering iron, and a laser marker.

Since the electro-optical conversion efficiency of a semiconductor laser array is about 50%, half of the input power is to be converted into heat. Such heat has a great impact on laser output power, efficiency, and element lifetime. In order to effectively cool such heat, used is a heat sink that employs water, which have a high thermal conductivity as well as a high heat capacity, as a refrigerant. As such a heat sink, known is one, for example, having a structure in which a plurality of copper plate-shaped members are combined to form a fine flow path and cooling water is circulated in the flow path. The cooling water is adapted to exchange heat with the semiconductor laser array placed on the flow path to cool the semiconductor laser array (refer to Patent Documents 1 and 2, for example).

Such a semiconductor laser apparatus as mentioned above has a stack structure in which a plurality of semiconductor laser arrays are stacked. In the case of achieving a higher output power, a plurality of heat sinks are to be inserted, respectively, between the stacked semiconductor laser arrays. Since these heat sinks are adapted not only to cool the semiconductor laser arrays but also to serve as an electrical conduction path between the semiconductor laser arrays, an electric field is to be applied also to the heat sinks during the operation of each semiconductor laser array (refer to FIG. 1 in Patent Document 1, for example).

Patent Document 1: International Patent Publication No. WO00/11717
Patent Document 2: Japanese Published Unexamined Patent Application No. H10-209531

DISCLOSURE OF THE INVENTION

Problem to be Solved by the Invention

The inventors have studied a conventional semiconductor laser apparatus in detail, and as a result, have found problems as follows. Namely, there is a problem that the conventional semiconductor laser apparatus including heat sinks that employ water as a refrigerant cannot sufficiently prevent the corrosion of the flow path to be described hereinafter, whereby it is impossible to efficiently and stably cool the semiconductor laser arrays to be cooled over a long period of time.

That is, in such a semiconductor laser stack apparatus as mentioned above, since the heat sinks form part of the electric circuit, a current flows through the heat sinks themselves and thereby through the water flowing inside the heat sinks. The cooling water employs ion-exchanged water with a restrained conductivity, which has a resistance of about 1 MΩ to cause a current of about 1 μA to flow at an applied voltage of about 1V, resulting in electrolysis of the water in the flow path using the heat sinks as electrodes. This causes the inner wall of the flow path to be electrochemically corroded. With the progress of such corrosion, clogging of the flow path, water leakage, and/or short circuits due to electrical leakage, etc., are more likely to occur.

In order to overcome the above-mentioned problems, it is an object of the present invention to provide a semiconductor laser apparatus having a structure for preventing the corrosion of a refrigerant flow path in a heat sink and for cooling a semiconductor laser array stably over a long period of time.

Means for Solving Problem

A semiconductor laser apparatus according to the present invention comprises a semiconductor laser array, a heat sink having a refrigerant flow path, a refrigerant including fluorocarbon and flowing through the refrigerant flow path, and a refrigerant supplier for supplying the refrigerant to the heat sink.

In accordance with the arrangement above, as a refrigerant adopted is fluorocarbon, which has a significantly lower reactivity and conductivity than water, whereby it is possible to avoid the corrosion of the refrigerant flow path. In addition, in this case, the refrigerant flowing through the refrigerant flow path is preferably controlled to have a flow velocity of 1 m/s or more but 10 m/s or less. By suppressing a flow velocity of the refrigerant at 10 m/s or less, the occurrence of cavitations can be effectively restrained. Also, by suppressing a flow velocity of the refrigerant at 1 m/s or more, the thermal resistance of the refrigerant can be reduced to achieve a sufficient cooling efficiency. The flow velocity of the refrigerant is to be controlled by adjusting the refrigerant supply pressure in the refrigerant supplier and by changing the shape of the refrigerant flow path.

In the semiconductor laser apparatus according to the present invention, the change in the cross-sectional area of the refrigerant flow path along the direction in which the refrigerant flows is preferably within ±30%. Thus, by reducing the change in the cross-sectional area of the flow path, the change in the flow velocity of the refrigerant can be effectively restrained. Accordingly, the occurrence of cavitations can be prevented more reliably. In this specification, the term "cross-sectional area of the flow path" means the sum of the area of the flow path in a cross-section perpendicular to the line of flow. When the refrigerant flow path has no branch, the term "cross-sectional area of the flow path" means the cross-sectional area of the single flow path. On the other hand, when the refrigerant flow path has a plurality of branches, the term "cross-sectional area of the flow path" means the sum of the cross-sectional area of the branches in a cross-section perpendicular to the line of flow.

In the semiconductor laser apparatus according to the present invention, the heat sink includes a microchannel-type or jet-cooling-type heat sink. The microchannel-type heat sink is for flowing the refrigerant through a fine refrigerant flow path to cool the semiconductor laser array from directly beneath. On the other hand, the jet-cooling-type heat sink is for ejecting the refrigerant through a small hole provided directly beneath the semiconductor laser array to perform heat exchange efficiently under the turbulent jet flow of the refrigerant. When fluorocarbon is adopted as a refrigerant and when the heat sink has a structure including such a fine refrigerant flow path, the cooling efficiency of the heat sink will be further improved.

Further, in the semiconductor laser apparatus according to the present invention, the refrigerant flow path preferably includes a fine flow path with a width of 1 mm or less. When the fluorocarbon is adopted as a refrigerant and when the heat sink has a structure including a fine flow path with a width of 1 mm or less, the cooling efficiency of the heat sink will be still further improved. In the present specification, the term "width of 1 mm or less" means that the minimum width of the refrigerant flow path in a cross-section perpendicular to the line of flow is 1 mm or less.

In the semiconductor laser apparatus according to the present invention, the heat sink has a structure in which a first plate-shaped member, a partition plate, and a second plate-shaped member are stacked. The first plate-shaped member has a first depressed portion formed in one surface thereof. The second plate-shaped member is provided on the first plate-shaped member and has a second depressed portion formed in the surface facing the one surface of the first plate-shaped member. The partition plate is provided between the first plate-shaped member and the second plate-shaped member and has a plurality of holes each making the first depressed portion and the second depressed portion become in communication with each other. The heat sink is further provided with a refrigerant supply port and a refrigerant discharge port. The refrigerant supply port is provided in such a manner as to penetrate through the first plate-shaped member, the partition plate, and the second plate-shaped member, in order to be in communication with the first depressed portion while preventing a communication with the second depressed portion. Then, the refrigerant discharge port is provided in such a manner as to penetrate through the second plate-shaped member, the partition plate, and the first plate-shaped member, in order to be in communication with the second depressed portion while preventing a communication with the first depressed portion. Therefore, when the first plate-shaped member, the partition plate, and the second plate-shaped member are stacked, the refrigerant flow path is defined by the refrigerant supply port, the first depressed portion, the plurality of holes, the second depressed portion, and the refrigerant discharge port.

In the heat sink, by thus forming the refrigerant flow path using the depressed portions and the holes provided in the components of the heat sink, the refrigerant can be branched into multiple paths, whereby the total amount of heat can be removed through multiple heat exchange portions while restraining the flow velocity for each branched flow path. In addition, by employing the structure in which the first plate-shaped member, partition plate, and second plate-shaped member are stacked, the thickness of the heat sink can be reduced.

Here, the semiconductor laser array is mounted on a surface facing the one surface, on which the first depressed portion is formed, of the first plate-shaped member in the heat sink, and a semiconductor laser unit is constituted by these semiconductor laser array and heat sink.

The semiconductor laser apparatus according to the present invention may be a semiconductor laser stack apparatus by comprising a plurality of semiconductor laser units each having the above-described structure. In this case, the plurality of semiconductor laser units are stacked such that refrigerant supply ports in heat sinks of the respective semiconductor laser units are in communication with each other, and that refrigerant discharge ports in the heat sinks of the respective semiconductor laser units are in communication with each other.

The semiconductor laser apparatus, having such a semiconductor laser stack structure, can extend the lifetime of the heat sinks and cool the semiconductor laser arrays stably, and therefore a stable output power can be achieved over a long period of time. Also, since the heat sinks have a reduced thickness, it is possible to reduce the size of the semiconductor laser stack device.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

EFFECT OF THE INVENTION

In accordance with the semiconductor laser apparatus according to the present invention, it is possible to prevent the corrosion of the refrigerant flow path in the heat sink and to cool the semiconductor laser array stably over a long period of time.

BRIEF DESCRIPTION OF THE DRAWINGS

FIG. 7 shows graphs summarizing the relationships in FIG. 5 and FIG. 6, respectively, for water and fluorocarbon;

DESCRIPTION OF THE REFERENCE NUMERALS

1 . . . semiconductor laser apparatus; 2a, 2b, 2c . . . semiconductor laser array; 10a, 10a', 10a", 10b, 10c . . . heat sink; 100a, 100b, 100c . . . semiconductor laser unit;

200 . . . semiconductor laser stack; 400 . . . refrigerant; and 500 . . . chiller (refrigerant supplier).

BEST MODE FOR CARRYING OUT THE INVENTION

In the following, embodiments of a semiconductor laser apparatus according to the present invention will hereinafter be described in detail with reference to FIGS. 1 to 9. In the explanation of the drawings, constituents identical to each other will be referred to with numerals identical to each other without repeating their overlapping descriptions.

Figure 1:
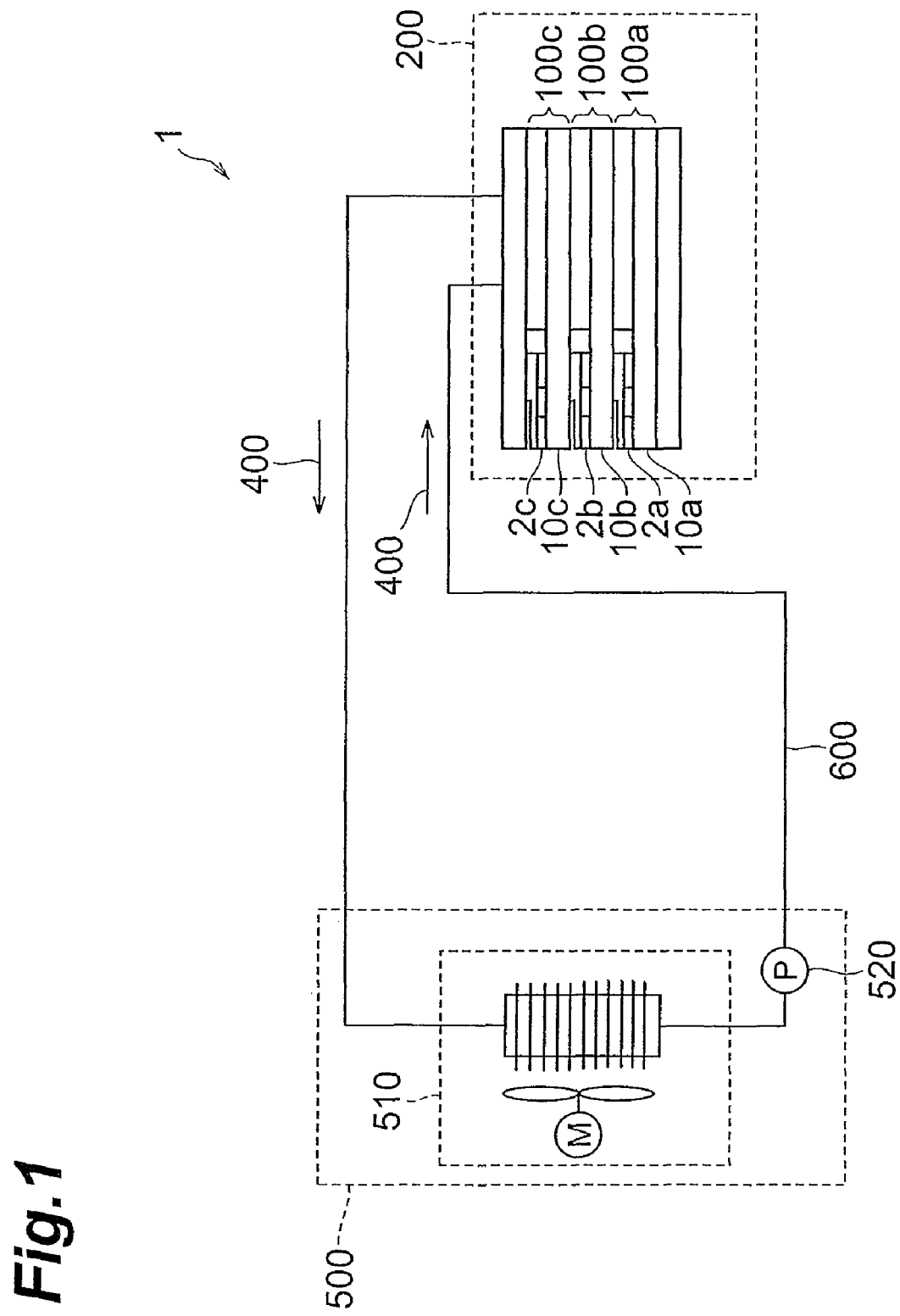
FIG. 1 is a view showing the configuration of an embodiment of a semiconductor laser apparatus according to the present invention.

FIG. 1 is a view showing the configuration of an embodiment of a semiconductor laser apparatus according to the present invention. The semiconductor laser apparatus 1 is constituted by a semiconductor laser stack 200 in which semiconductor laser units 100a to 100c are stacked, a chiller (refrigerant supplier) 500, a piping 600 for connection between these components, and a refrigerant 400 flowing through these components.

The chiller 500 comprises an air-cooling unit 510 and a circulation pump 520. The air-cooling unit 510 is adapted to cool the refrigerant, and the circulation pump 520 is adapted to supply the refrigerant 400 to the semiconductor laser stack 200 via the piping 600.

The refrigerant 400 is comprised of fluorocarbon. Fluorocarbon is a compound in which some or all of the hydrogen atoms in the hydrocarbons are replaced by fluorine atoms. Since fluorine atoms have an atomic radius larger than that of hydrogen atoms, the atomic framework of the carbons becomes as when covered with the fluorine atoms after fluorine atoms are replaced. Also, since fluorine atoms have a high electronegativity, an electron cloud exists locally nearer the fluorine atoms. This causes the electron concentration in the framework portion of the carbons to be reduced, resulting in a significant reduction in reactivity. As a result, fluorocarbon has a high chemical stability to react with few substances. Further, since fluorocarbon has a significantly high resistivity of $10^{13}\Omega \cdot m$ relative to that of water $10^{7}\Omega \cdot m$, electrolysis due to energization is not likely to occur unlike water. It is further preferable that the refrigerant be perfluorocarbon, a compound in which all of the hydrogen atoms in the hydrocarbons are replaced by fluorine atoms. Perfluorocarbon, which in particular has a high chemical stability and also a high resistivity, is particularly preferable as the refrigerant.

Figure 2:
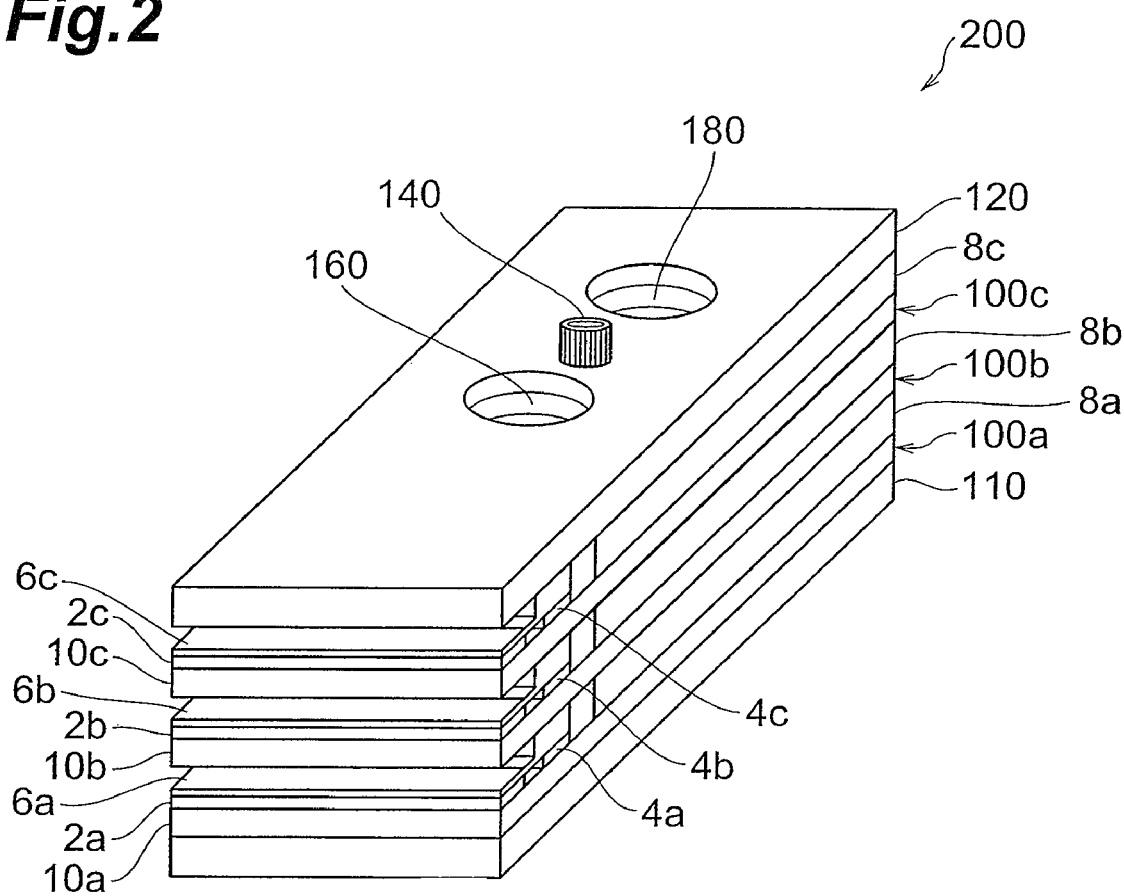
FIG. 2 is a perspective view showing the structure of a semiconductor laser stack in the semiconductor laser apparatus shown in FIG. 1.

FIG. 2 is a perspective view showing the structure of the semiconductor laser stack in the semiconductor laser apparatus shown in FIG. 1. The semiconductor laser stack 200 comprises three semiconductor laser units 100a to 100c, a positive electrode 110, a negative electrode 120, a retaining screw 140, a supply port (refrigerant supply port) 160, and a discharge port (refrigerant discharge port) 180. The semiconductor laser units 100a to 100c have, respectively, semiconductor laser arrays 2a to 2c, dummy spacers 4a to 4c, n-type electrodes 6a to 6c, sealing silicon rubbers 8a to 8c, and heat sinks 10a to 10c. The semiconductor laser array 2a is arranged between the upper surface of the heat sink 10a (corresponding to the upper surface of an upper plate member 40 to be described hereinafter) and the lower surface of the heat sink 10b (corresponding to the lower surface of a lower plate member 20 to be described hereinafter), the semiconductor laser array 2b is arranged between the upper surface of the heat sink 10b and the lower surface of the heat sink 10c, and the semiconductor laser array 2c is mounted on the upper surface of the heat sink 10c. These components are fixed using the retaining screw 140 in a stacked manner.

The heat sinks 10a to 10c are comprised of conductive material, and the positive electrode 110, heat sink 10a, semiconductor laser array 2a, n-type electrode 6a, heat sink 10b, semiconductor laser array 2b, n-type electrode 6b, heat sink 10c, semiconductor laser array 2c, n-type electrode 6c, and negative electrode 120 are connected electrically in this order. Applying a voltage between the positive and negative electrodes 110 and 120 allows the semiconductor laser arrays 2a to 2c to emit a laser beam.

Each of the semiconductor laser arrays 2a to 2c includes a plurality of linearly arranged semiconductor laser elements, and therefore has a plurality of laser emitting spots arranged in a line. The present embodiment adopts semiconductor laser arrays in which a plurality of semiconductor laser elements are integrated in a monolithic manner. In such semiconductor laser arrays, active layers and electrodes are commonly divided by a plurality of stripe waveguides to be arranged in parallel. Additionally, the semiconductor laser apparatus according to the present invention may adopt semiconductor laser arrays having a structure in which a plurality of independent semiconductor laser chips are arranged in line, instead of the semiconductor laser arrays having such a structure as mentioned above.

The supply and discharge ports 160 and 180 are provided in such a manner as to penetrate through the semiconductor laser units 100a to 100c. The supply port 160 is connected to supply ports 160a to 160c formed in the respective semiconductor laser units 100a to 100c (described hereinafter in detail), while the discharge port 180 is connected to discharge ports 180a to 180c formed in the respective semiconductor laser units 100a to 100c (described hereinafter in detail). This enables the refrigerant made of fluorocarbon to be supplied to the heat sinks 10a to 10c through the supply port 160 and also to be discharged from the heat sinks 10a to 10c the discharge port 180.

Next, the semiconductor laser units 100a to 100c will be explained. In addition, since the semiconductor laser units 100a to 100c have the same structure, only the semiconductor laser unit 100a will be explained below.

Figure 3:
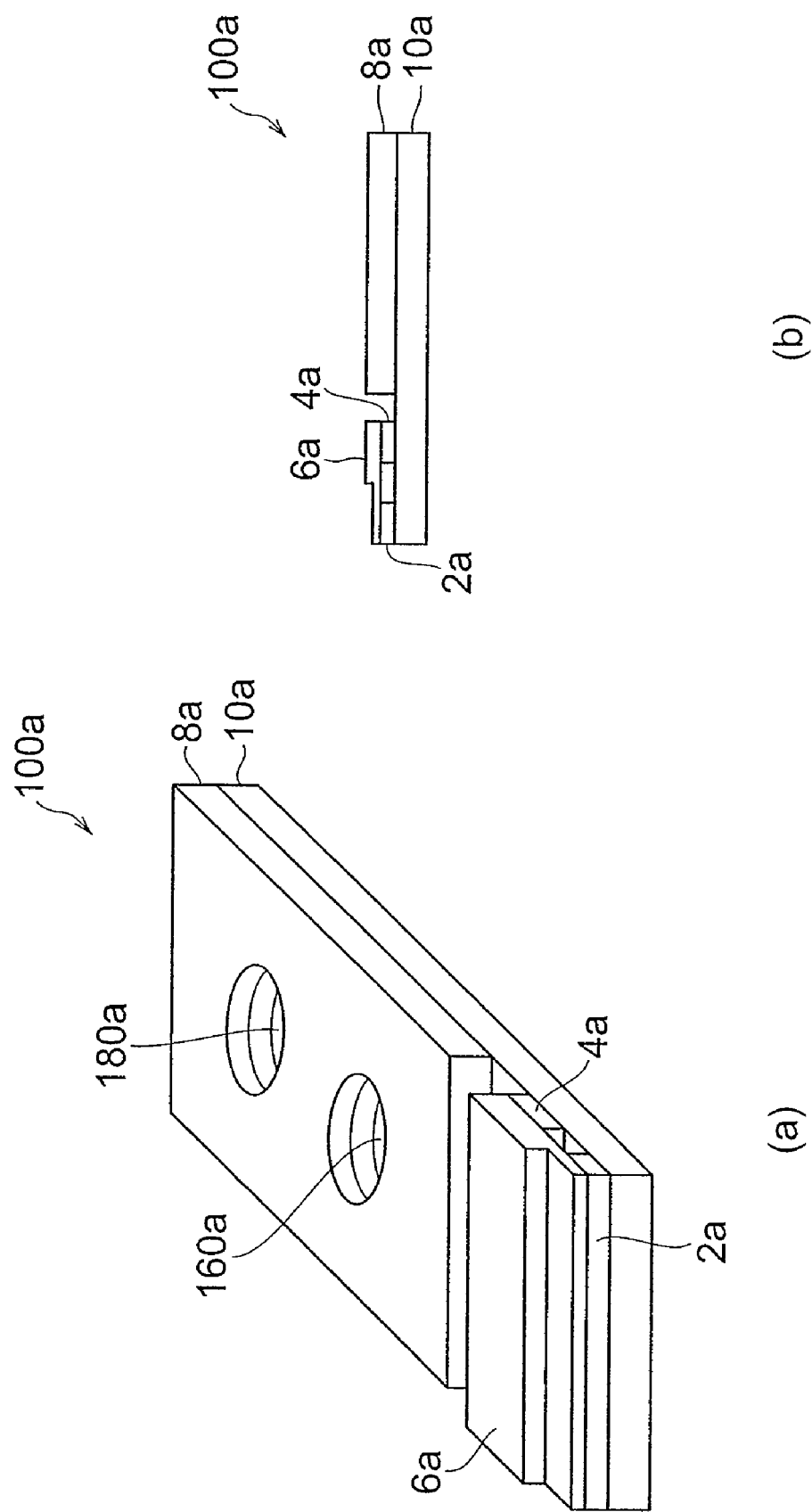
FIG. 3 shows perspective and side plan views of the structure of a semiconductor laser unit that constitutes a part of the semiconductor laser stack shown in FIG. 2.

FIG. 3 shows the structure of a semiconductor laser unit that constitute a part of the semiconductor laser stack shown in FIG. 2. The area (a) of FIG. 3 shows a perspective view of the semiconductor laser unit, and the area (b) of FIG. 3 shows a side plan view of the semiconductor laser unit.

The semiconductor laser unit 100a comprises the semiconductor laser array 2a, dummy spacer 4a, n-type electrode 6a, sealing silicon rubber 8a, and heat sink 10a. The semiconductor laser array 2a, dummy spacer 4a, and sealing silicon rubber 8a are mounted on the upper surface of the heat sink 10a. The dummy spacer 4a mounted adjacent to the semiconductor laser array 2a has approximately the same thickness as the semiconductor laser array 2a, and the n-type electrode 6a is mounted on the dummy spacer 4a and the semiconductor laser array 2a. The sealing silicon rubber 8a with the supply and discharge ports 160a and 180a provided therein in a penetrating manner functions in such a manner as to ensure insulation against a heat sink to be stacked thereon and to prevent leakage of the refrigerant.

Figure 4:
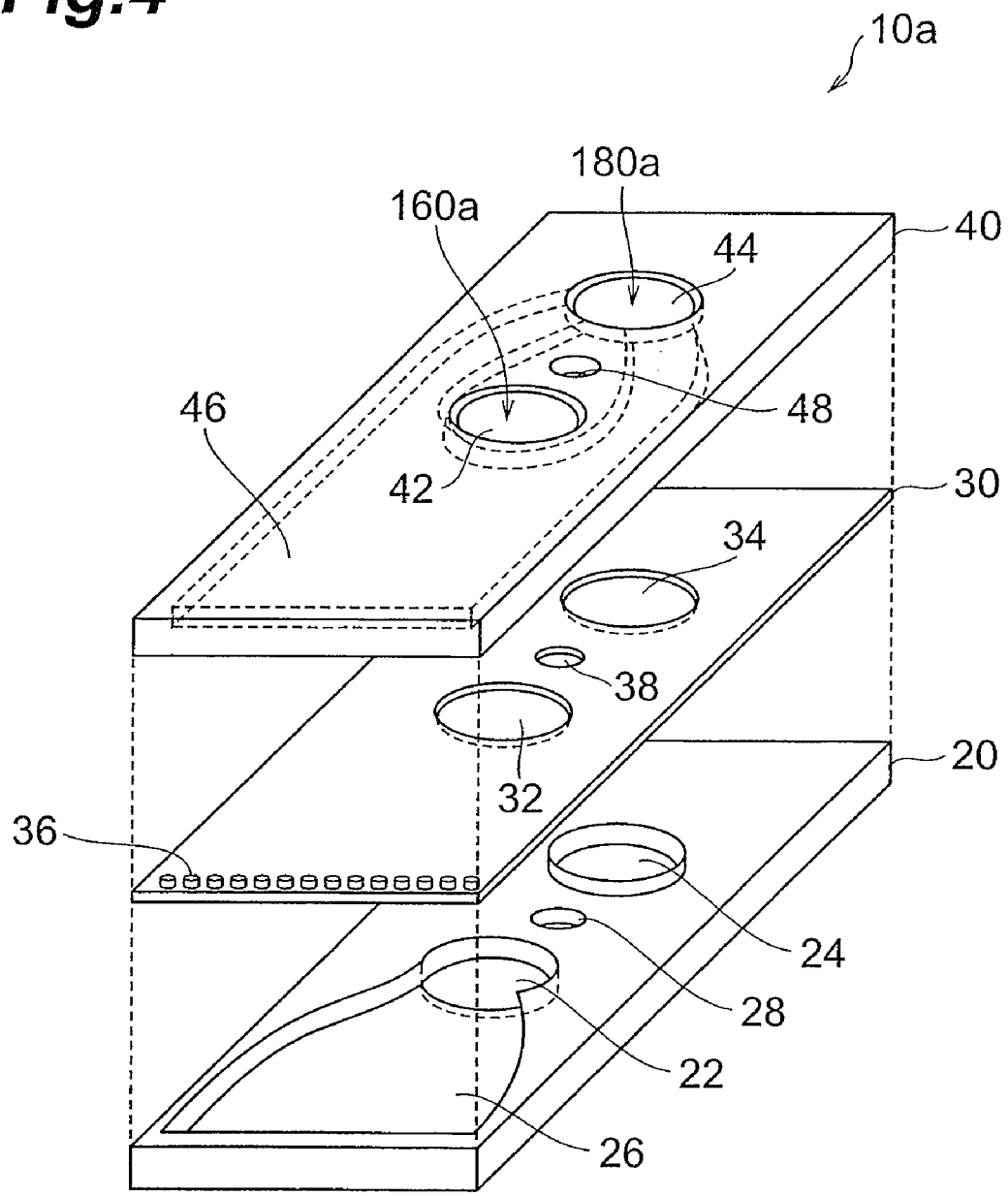
FIG. 4 is a view showing an assembling process for a heat sink having a three-layer structure.

FIG. 4 is a view showing an assembling process for a heat sink having a three-layer structure as an example of the foregoing heat sink 10a. The heat sink 10a is a jet-cooling-type one. The heat sink 10a has a structure in which a lower plate member 20 (first plate-shaped member), an intermediate plate member 30 (partition plate), and an upper plate member 40 (second plate-shaped member) are stacked in this order. The lower plate member 20 is a copper plate with a thickness of about 400 μm and has two through holes 22 and 24. On the upper surface of the lower plate member 20 (to be brought into contact with the intermediate plate member 30), a refrigerant flow path depressed portion 26 (first depressed portion), having a depth of about 200 μm, is formed. The refrigerant flow path depressed portion 26 has a bell shape, the top of the bell shape is in communication with the through hole 22, and the bottom of the bell shape extends toward one end of the lower plate member 20 (in the direction in which the semiconductor laser array 2a is to be disposed). Between the through holes 22, 24 and approximately in the central part of the lower plate member 20, a screw hole 28 is provided to be used for screw retention with the foregoing retaining screw 140.

The upper plate member 40 is also a copper plate with a thickness of about 400 μm, and has two through holes 42, 44 in positions corresponding to those of the through holes 22, 24 in the lower plate member 20. In the lower surface of the upper plate member 40 (to be brought into contact with the intermediate plate member 30), a refrigerant flow path depressed portion 46 (second depressed portion), having a depth of about 200 μm, is formed. The refrigerant flow path depressed portion 46 has a bell shape, the top of the bell shape is in communication with the through hole 44, and the bottom of the bell shape extends toward one end of the upper plate member 40 (in the direction in which the semiconductor laser array 2a is to be disposed). Meanwhile, as shown in FIG. 4, the through hole 42 is isolated like an island within the refrigerant flow path depressed portion 46 so as not to be in communication with the depressed portion. Also, in the upper plate member 40, a screw hole 48 is provided in a position corresponding to that of the screw hole 28 in the lower plate member 20.

The intermediate plate member 30 is a copper plate with a thickness of about 100 μm, and has through holes 32, 34 in positions corresponding to those of the through holes 22, 24 in the lower plate member 20. Also, a screw hole 38 is provided in a position corresponding to that of the screw hole 28 in the lower plate member 20. Further, a plurality of conduit holes 36 is formed in a portion in which the semiconductor laser array 2a is to be disposed.

When the upper surface of the lower plate member 20 and the lower surface of the intermediate plate member 30 are joined, and when the upper surface of the intermediate plate member 30 and the lower surface of the upper plate member 40 are joined, the refrigerant flow path depressed portion 26 formed in the lower plate member 20 and the lower surface of the intermediate plate member 30 form a space that defines a part of the refrigerant flow path. Similarly, the refrigerant flow path depressed portion 46 formed in the upper plate member 40 and the upper surface of the intermediate plate member 30 form a space that defines a part of the refrigerant flow path.

When the through hole 22 formed in the lower plate member 20, the through hole 32 formed in the intermediate plate member 30, and the through hole 42 formed in the upper plate member 40 are connected, the supply port 160a for supplying the refrigerant to the refrigerant flow path is formed. On the other hand, when the through hole 24 formed in the lower plate member 20, the through hole 34 formed in the intermediate plate member 30, and the through hole 44 formed in the upper plate member 40 are connected, the discharge port 180a for discharging the refrigerant from the refrigerant flow path is formed.

Then, the refrigerant flow path is formed by a combination of the supply port 160a, the refrigerant flow path depressed portion 26, the conduit holes 36, the refrigerant flow path depressed portion 46, and the discharge port 180a. The conduit holes 36 are fine flow paths having a width of 1 μm or less.

Here, the diameter of the conduit holes 36 is sufficiently small to shed the refrigerant into the refrigerant flow path depressed portion 46 to be turbulent jet flow. Further, in order to bring the refrigerant into turbulent jet flow, the refrigerant flowing inside the heat sink 10a is preferably controlled to have a flow velocity of 1 m/s or more, and more preferably 2 m/s or more. On the other hand, since the conduit holes 36 are provided in plurality, the refrigerant flowing through the refrigerant flow path is controlled to have a flow velocity of 10 m/s or less across the entire refrigerant flow path. The flow velocity of the refrigerant is to be controlled by, for example, adjusting the refrigerant supply pressure of the circulation pump 520 in the chiller 500 shown in FIG. 1. Further, the refrigerant flow path in the heat sink 10a is branched into the plurality of conduit holes 36, and the change in the cross-sectional area of the flow path when calculated by summing the area of the branches is set within ±30%.

Next, the functions of the semiconductor laser apparatus according to the present invention will be explained.

Figure 5:
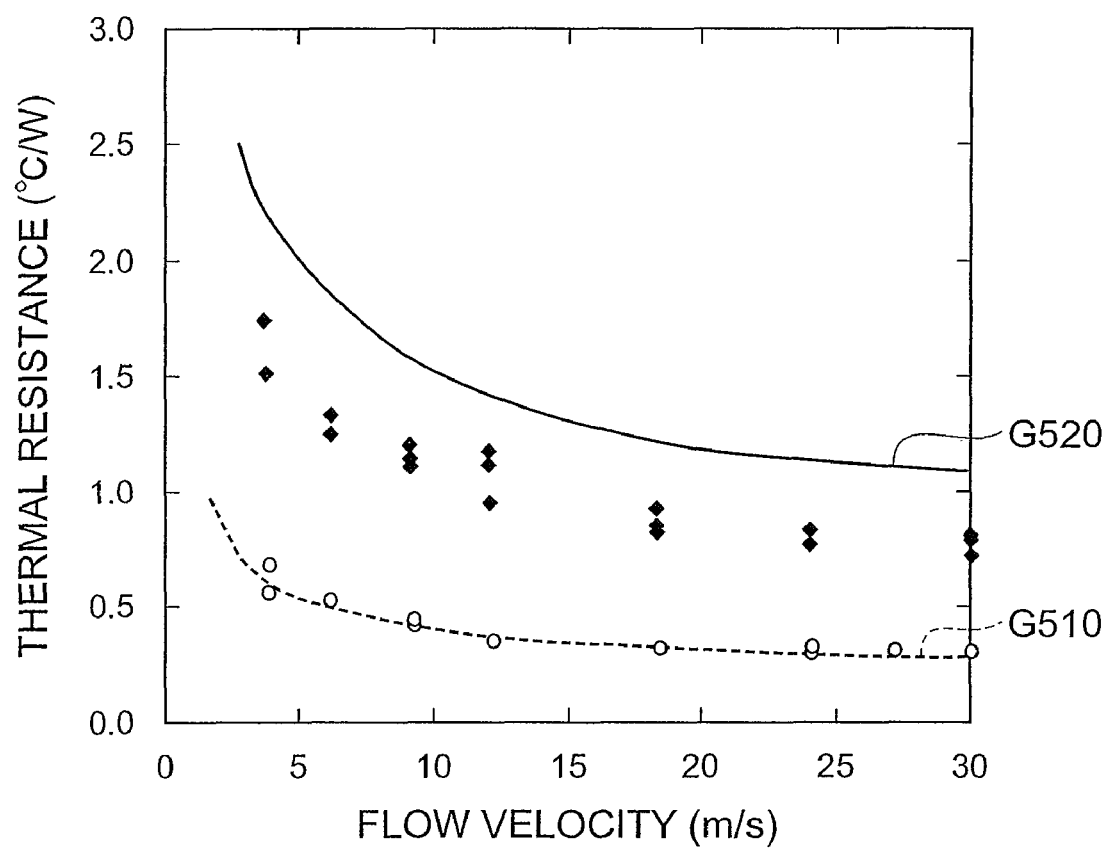
FIG. 5 is a graph showing the relationship between flow velocity and thermal resistance for water and fluorocarbon flowing through a fine flow path.

In the present semiconductor laser apparatus, fluorocarbon is adopted as a refrigerant instead of water, which has conventionally been adopted. FIG. 5 is a graph showing the relationship between flow velocity and thermal resistance for water and fluorocarbon flowing through a fine flow path. In the graph shown in FIG. 5, the horizontal axis represents flow velocity, while the vertical axis represents thermal resistance. Also, the curve G510 indicates calculated values while symbols "○(circular)" show actually measured values for water. The curve G520 indicates calculated values while symbols "◆(solid-diamond)" show actually measured values for fluorocarbon.

It has conventionally been known that the heat transfer characteristics of fluorocarbon are significantly inferior to those of water, and have not been adopted as a refrigerant for semiconductor laser arrays. As shown in FIG. 5, the thermal resistance of fluorocarbon (curve G520) is significantly greater than that of water (curve G510) for each flow velocity range, indicating inferiority as a refrigerant to support the conventional awareness.

However, the present inventors have actually carried out experiments under the assumption that fluorocarbon and water are each adopted as a refrigerant for the heat sinks in the semiconductor laser apparatus to find that the heat transfer characteristics of fluorocarbon are better than expected. The actually measured values (indicated by symbols "◆" and symbols "○") shown in FIG. 5 are plotted using measured values of thermal resistance against flow velocity when fluorocarbon and water are each flowed through a fine flow path with a width of 1 mm simulating the refrigerant flow path in the heat sinks of the semiconductor laser apparatus. As found from the actually measured values in FIG. 5, the actual thermal resistance of fluorocarbon is significantly smaller than the calculated values. As for the calculated values (curve G520), the thermal resistance of fluorocarbon is 1° C./W or more greater than that of water for each flow velocity range, while as for the actually measured values (symbols "◆"), the difference is about 0.5° C./W. In addition, as can be seen from FIG. 5, the calculated values (curve G510) and the actually measured values (symbols "○") for water coincide well with each other.

The reason that the heat transfer characteristics of fluorocarbon are thus found better in the actually measured values obtained by simulating the semiconductor laser apparatus than in the calculated values can be considered as follows. That is, the surface tension of fluorocarbon is smaller than that of water. Therefore, when fluorocarbon is flowed through such a fine refrigerant flow path as in the semiconductor laser apparatus, the fluorocarbon can proceed into finer portions in the refrigerant flow path, resulting in a more increased thermal conduction effect than expected. Accordingly, it can be considered that the thermal resistance gets smaller than the calculated values.

As described above, it is found that fluorocarbon can achieve a cooling efficiency close to that of water if adopted as a refrigerant for the heat sinks in the semiconductor laser apparatus. Then, fluorocarbon, which has a significantly higher chemical stability and a lower conductivity than water, has potential for prevention of corrosion of the refrigerant flow path.

Meanwhile, it is found that fluorocarbon is more likely to generate cavitations than water if adopted as a refrigerant. Cavitation is a phenomenon of generating voids in fluid due to evaporation of the fluid and/or separation of dissolved gas, etc., that may occur in portions having a locally lower pressure caused by the flowing of the fluid. When cavitations may occur, the contact area with the heating element is to be reduced, resulting in a reduction in heat exchange efficiency.

Figure 6:
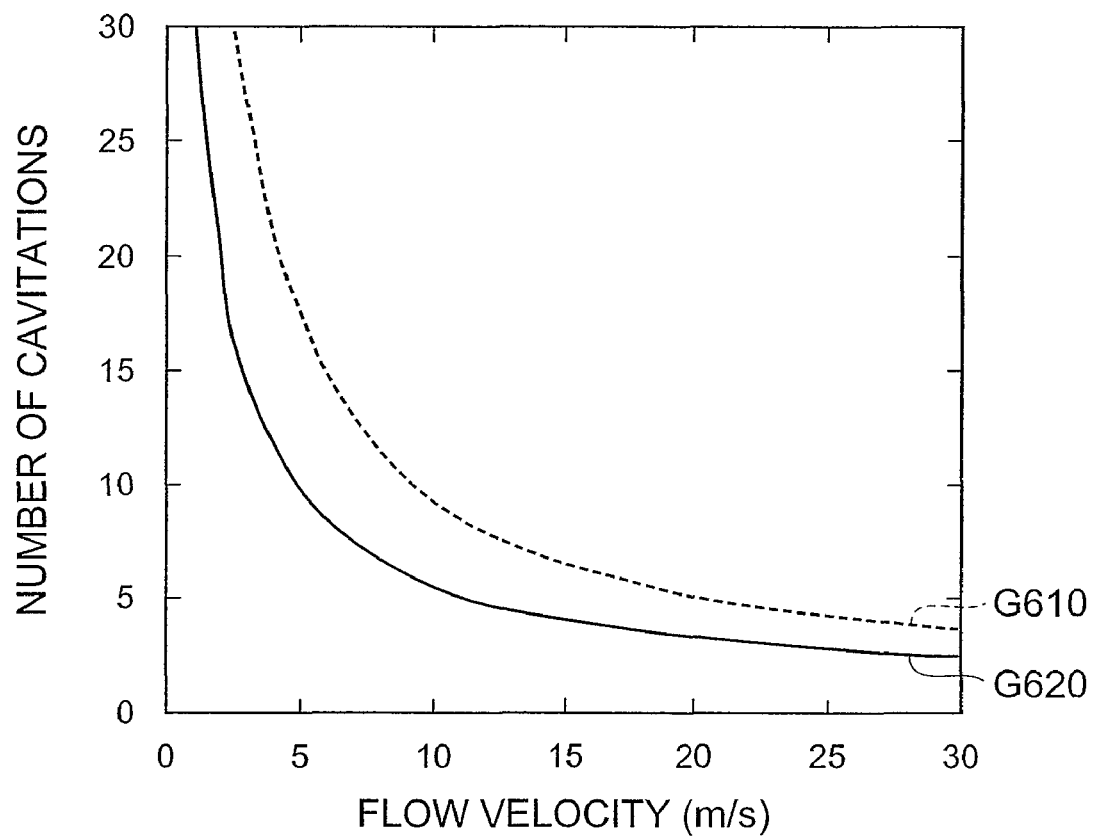
FIG. 6 is a graph showing the relationship between flow velocity and the number of cavitations for water and fluorocarbon.

FIG. 6 is a graph showing the relationship between flow velocity and the number of cavitations for water and fluorocarbon, where the curve G610 indicates the relationship between flow velocity and the number of cavitations for water, while the curve G620 indicates the relationship between flow velocity and the number of cavitations for fluorocarbon. As can be seen from FIG. 6, fluorocarbon (curve G620) has a smaller number of cavitations and is more likely to generate cavitations than water (curve G610) for each flow velocity range. In particular, when the number of cavitations sinks below 5, cavitations are much more likely to occur. However, also in the case of fluorocarbon, the number of cavitations increases drastically and the risk of generating cavitations decreases rapidly at a flow velocity of 10 m/s or less. Hence, the present invention is designed in such a manner that the refrigerant flow path is branched into multiple paths by the depressed portions and the conduit holes to restrain the flow velocity for each branch to 10 m/s or less, whereby the total amount of heat can be removed through multiple heat exchange portions while preventing the occurrence of cavitations.

FIG. 7 shows graphs summarizing the above-described relationships. In FIG. 7, the area (a) shows the relationship between flow velocity and thermal resistance as well as that between flow velocity and the number of cavitations for water, and the area (b) shows the relationship between flow velocity and thermal resistance as well as that between flow velocity and the number of cavitations for fluorocarbon. The curve G710TF shown in the area (a) of FIG. 7 corresponds to the curve G510 shown in FIG. 5, while the curve G710CF corresponds to the curve G610 shown in FIG. 6. Also, the curve G720TF shown in the area (b) of FIG. 7 corresponds to the curve G520 shown in FIG. 5, while the curve G720CF corresponds to the curve G620 shown in FIG. 6. It is found from these graphs that the thermal resistance and the risk of generating cavitations are in a trade-off relationship with respect to flow velocity. When cavitations may occur, there will occur significantly negative impacts such as reduction in heat exchange efficiency and erosion (mechanical corrosion). It is therefore necessary to improve the thermal efficiency while restraining the flow velocity. From the foregoing viewpoints, the present inventors decided to control the refrigerant made of fluorocarbon and flowing through the refrigerant flow path in the heat sinks to have a flow velocity of preferably 1 to 10 m/s, more preferably 2 to 8 m/s, and further preferably 3 to 7 m/s. At this flow velocity, it is possible to maintain a cooling efficiency not as inferior to the case where water is adopted as a refrigerant while restraining the risk of cavitations.

The risk of generating cavitations depends also on the change in the flow velocity of the refrigerant. When the flow velocity of the refrigerant changes significantly, cavitations are likely to occur even if the average flow velocity of the refrigerant may be the same. The flow velocity of the refrigerant is in inverse proportion to the cross-sectional area of the refrigerant flow path. Hence, the present invention is designed in such a manner that the change in the cross-sectional area of the refrigerant flow path in the heat sinks is within ±30%.

Figure 8:
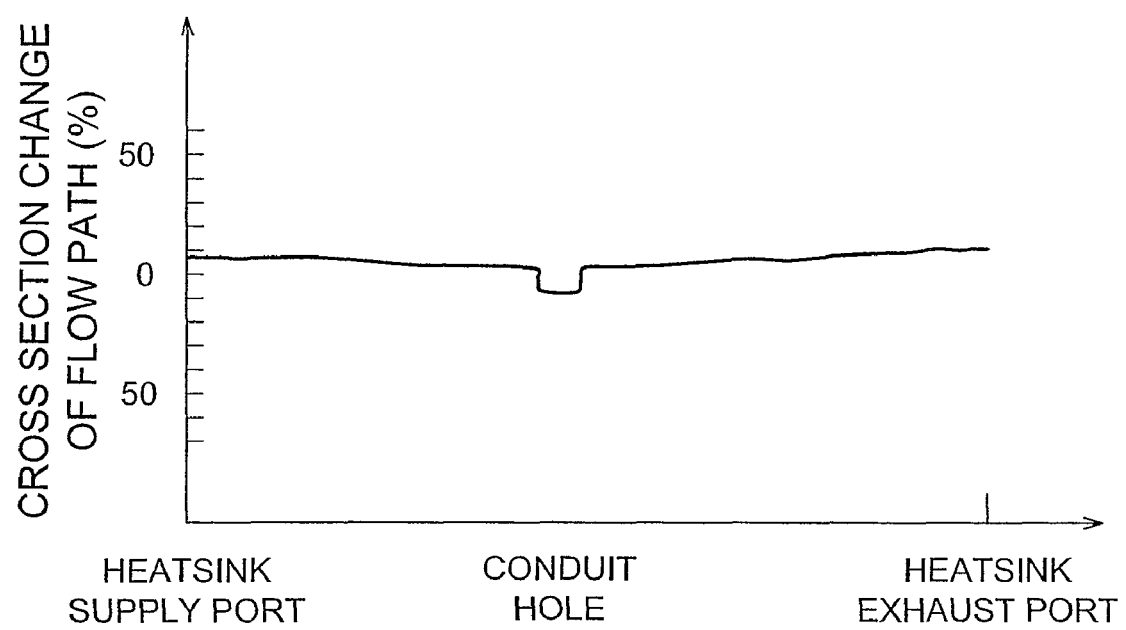
FIG. 8 is a graph showing the change in the cross-sectional area of the refrigerant flow path from the supply port through the discharge port in a heat sink.

FIG. 8 is a graph showing the change in the cross-sectional area of the refrigerant flow path from the supply port through the discharge port in a heat sink. As can be seen from FIG. 8, the cross-sectional area of the flow path is approximately constant from the supply port through the conduit holes in the heat sink. The cross-sectional area of the flow path decreases at the conduit holes (a plurality of holes provided in the partition plate in the heat sink) where the refrigerant is to be ejected. Then, the cross-sectional area of the flow path increases again after passing through the conduit holes. However, the change in the cross-sectional area of the flow path is within ±30%, and more preferably within ±10%. This structure can restrain the fluctuation in the flow velocity of the refrigerant to avoid the occurrence of cavitations effectively.

When the semiconductor laser apparatus 1 having such a structure as shown in FIG. 1 operates, the refrigerant 400 comprised of fluorocarbon and cooled in the chiller 500 is supplied to the semiconductor laser stack 200 through the piping 600. The refrigerant 400 is then supplied to the heat sinks 10*a* to 10*c*. The refrigerant 400 comprised of fluorocarbon and supplied to the heat sinks 10*a* to 10*c* cools the semiconductor laser arrays 2*a* to 2*c* arranged on the heat sinks 10*a* to 10*c*. The refrigerant 400 discharged from the heat sinks 10*a* to 10*c* is returned to the chiller 500 via the piping 600, and then cooled again to cool the heat sinks 10*a* to 10*c* in the semiconductor laser stack 200.

The refrigerant 400 comprised of fluorocarbon and flowing through the heat sinks 10*a* to 10*c*, which is controlled to have a flow velocity of 1 to 10 m/s, can achieve efficient cooling without generating cavitations. Further, since the change in the cross-sectional area of the refrigerant flow path in the heat sinks is restrained within ±30%, it is also possible to avoid the occurrence of cavitations due to flow velocity change. This allows the semiconductor laser arrays 2*a* to 2*c* to be cooled efficiently with no erosion of the refrigerant flow path.

Further, since the refrigerant 400 comprised of fluorocarbon cannot corrode the refrigerant flow path, it is possible to cool the semiconductor laser arrays 2*a* to 2*c* stably over a long period of time. Accordingly, it is possible to extend the element lifetime and to achieve stable light output.

Figure 9:
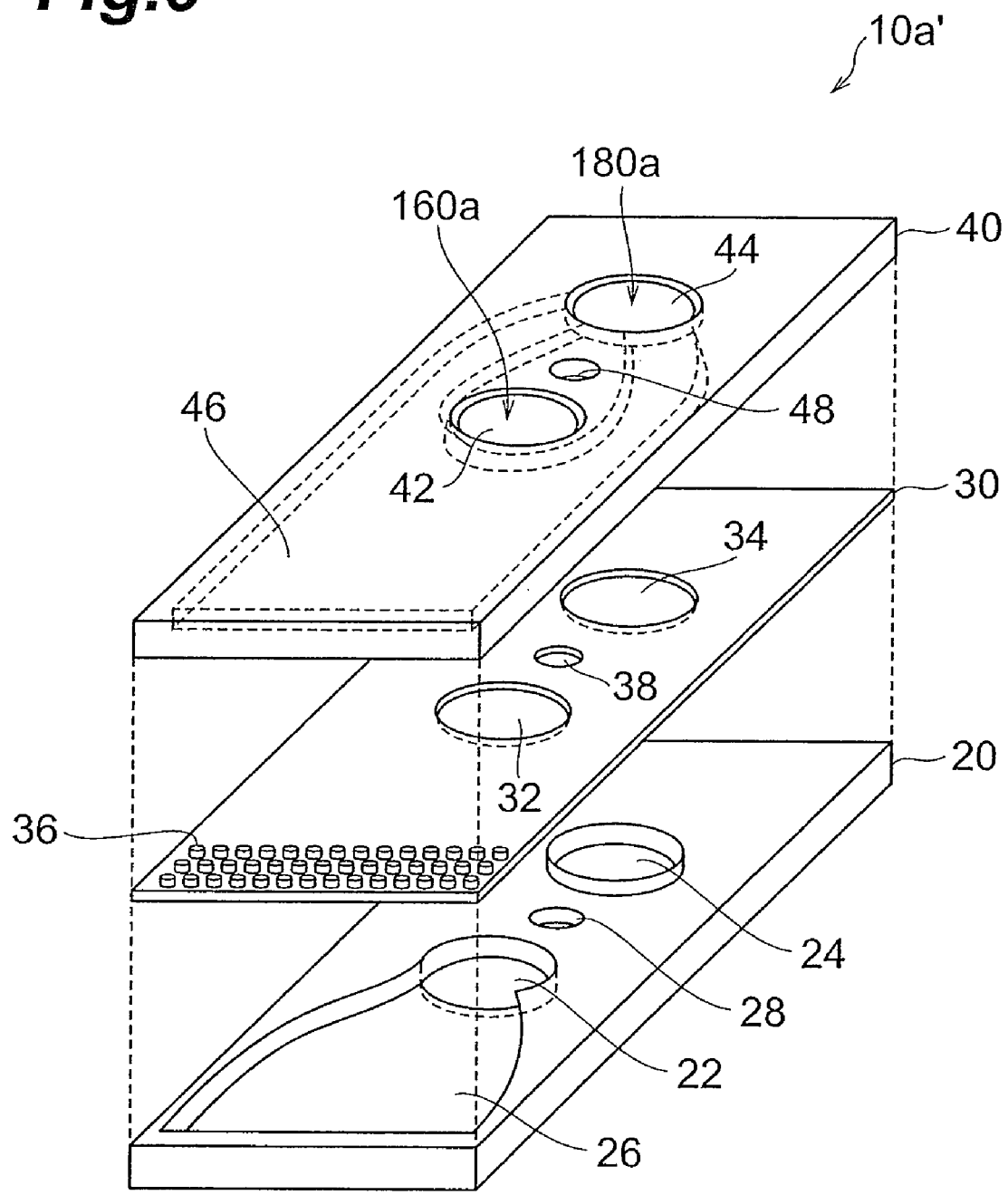
FIG. 9 is a view showing an assembling process for another heat sink having a three-layer structure.

FIG. 9 is a view showing an assembling process for another heat sink having a different three-layer structure from that shown in FIG. 4. The heat sink 10*a*' is different from the heat sink 10*a* shown in FIG. 4 in that the number of conduit holes 36 is greater than those in the heat sink 10*a* shown in FIG. 4. This causes the refrigerant flow path to further have more branches, which further reduces the change in the cross-sectional area of the flow path obtained by summing the area of the branches.

Figure 10:
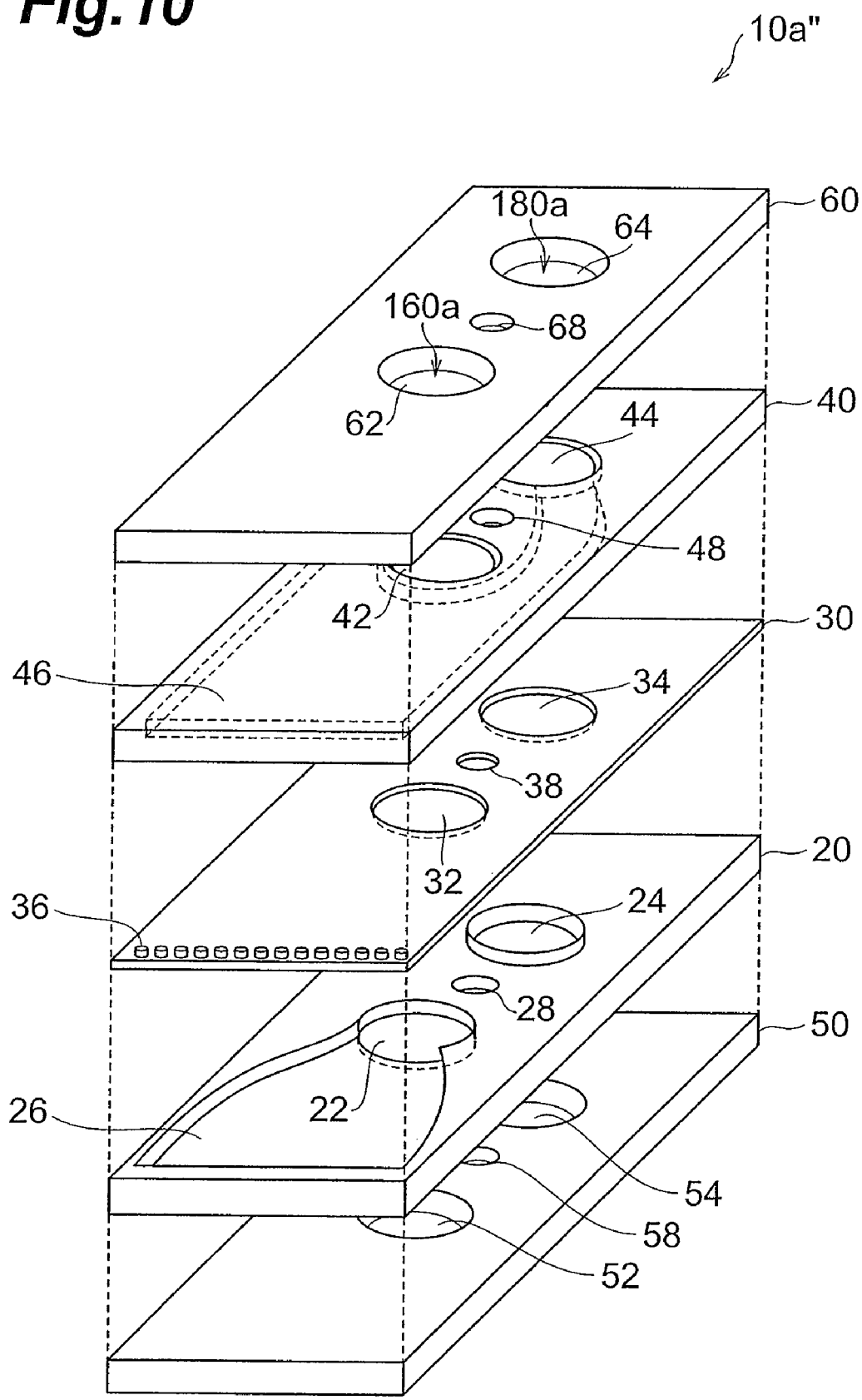
FIG. 10 is a view showing an assembling process for a heat sink having a five-layer structure.

FIG. 10 is a view showing an assembling process for a heat sink having a five-layer structure. The heat sink 10*a*" is different from the heat sink 10*a* shown in FIG. 4 in that a lower intermediate plate member 50 is joined to the lower side of the lower plate member 20 in the three-layer heat sink 10*a* shown in FIG. 4, and that an upper intermediate plate member 60 is joined to the upper side of the upper plate member 40. In the lower intermediate plate member 50, there are provided through holes 52, 54 and a screw hole 58 that correspond, respectively, to the through holes 22, 24 and the screw hole 28 in the lower plate member 20. In the upper intermediate plate member 60, there are provided through holes 62, 64 and a screw hole 68 that correspond, respectively, to the through holes 42, 44 and the screw hole 48 in the upper plate member 40. Then, when a retaining screw is screwed into the screw holes 58, 68, the lower intermediate plate member 50 and the upper intermediate plate member 60 are to be joined, respectively, to the lower plate member 20 and the upper plate member 40. Accordingly, the through holes 52, 22, 32, 42, 62 are to be connected to form a supply port 160*a* for supplying the refrigerant to the refrigerant flow path. Also, the through holes 54, 24, 34, 44, 64 are to be connected to form a discharge port 180*a* for discharging the refrigerant from the refrigerant flow path. The five-layer heat sink 10*a*", in which the lower intermediate plate member 50 and the upper intermediate plate member 60 are arranged additionally, has a further improved durability.

In addition, although the foregoing embodiments describe the semiconductor laser apparatuses with jet-cooling-type heat sinks adopted therein, microchannel-type heat sinks may be adopted.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The semiconductor laser apparatus according to the present invention can achieve a high output power of several to 100 W, which therefore is applicable to a light source of, for example, a laser knife, a laser soldering iron, and a laser marker.

The invention claimed is:

1. A semiconductor laser apparatus, comprising:
a semiconductor laser array;
a heat sink having a refrigerant flow path which includes plural branches, said heat sink having a supply port serving as one end of said refrigerant flow path and a discharge port serving as the other end of said refrigerant flow path;
a liquid refrigerant including fluorocarbon and flowing through said refrigerant flow path;
a piping, through which the liquid refrigerant circulates, having one end connected to said supply port and the other end connected to said discharge port; and
a refrigerant supplier for supplying the liquid refrigerant to said heat sink, said refrigerant supplier having a circulation pump which is provided at a predetermined portion of said piping and controls a flow velocity of the liquid refrigerant at 10 m/s or less for every branch of said refrigerant flow path so as to inhibit the occurrence of cavitations in the liquid refrigerant.

2. A semiconductor laser apparatus according to claim 1, wherein said circulation pump controls the velocity of the liquid refrigerant at 1 m/s or more for every branch of said refrigerant flow path.

3. A semiconductor laser apparatus according to claim 1, wherein the change in the cross-sectional area of said refrigerant flow path along the direction in which the refrigerant flows is within ±30%.

* * * * *